United States Patent
Islam

(10) Patent No.: US 9,118,187 B1
(45) Date of Patent: Aug. 25, 2015

(54) VIBRATIONAL ENERGY HARVESTER

(71) Applicant: Amazon Technologies, Inc., Reno, NV (US)

(72) Inventor: Rashed Adnan Islam, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 344 days.

(21) Appl. No.: 13/828,740

(22) Filed: Mar. 14, 2013

(51) Int. Cl.
*H02J 7/00* (2006.01)
*H02K 35/02* (2006.01)
*H02N 2/18* (2006.01)

(52) U.S. Cl.
CPC . *H02J 7/00* (2013.01); *H02K 35/02* (2013.01); *H02N 2/186* (2013.01)

(58) Field of Classification Search
CPC ........ Y02E 60/12; H02J 7/0068; H02J 7/022; H02J 7/0073; H02J 7/0054; H02J 7/1423; H01M 10/44; H01M 10/46

USPC .......................................... 320/103
See application file for complete search history.

(56) References Cited

U.S. PATENT DOCUMENTS

| 4,654,554 | A | * | 3/1987 | Kishi | 381/190 |
| 5,609,230 | A | * | 3/1997 | Swinbanks | 188/267 |
| 2004/0212794 | A1 | * | 10/2004 | Mizuno | 355/72 |
| 2008/0129147 | A1 | * | 6/2008 | Thiesen et al. | 310/319 |
| 2009/0200983 | A1 | * | 8/2009 | Dyer et al. | 320/107 |
| 2010/0045119 | A1 | * | 2/2010 | Jackson et al. | 310/20 |
| 2011/0074231 | A1 | * | 3/2011 | Soderberg | 310/44 |
| 2011/0254285 | A1 | * | 10/2011 | Hanchett, Jr. | 290/1 R |

* cited by examiner

*Primary Examiner* — Arun Williams
(74) *Attorney, Agent, or Firm* — Lee & Hayes, PLLC

(57) ABSTRACT

Some examples include an energy harvester for use in an electronic device to convert mechanical energy associated with vibrations of the electronic device into electrical energy. For instance, an energy harvester including rows of piezoelectric cantilevers may be arranged around a proof mass and may be utilized to convert the vibrations into electrical energy. In some examples, the energy harvester may include an electromagnetic energy harvester in addition to, or in place of the piezoelectric energy harvester.

22 Claims, 8 Drawing Sheets

VIBRATIONAL ENERGY HARVESTER

BACKGROUND

One of the major problems facing manufacturers of portable electronic devices is achieving an effective balance between the size of the portable electronic device and battery life. The manufacturers of these devices typically resort to either reducing power consumption or increasing battery size. However, reducing power consumption is often difficult without reducing feature sets. On the other hand, increasing the battery size also increases the size of the portable electronic device, often making the portable electronic device heavier and more difficult operate. Therefore, manufacturers of electronic devices look to alternative solutions for increasing battery life without reducing function or increasing size of the portable electronic device.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

DETAILED DESCRIPTION

This disclosure includes techniques and implementations for energy harvesting in a portable electronic device. For example, an energy harvesting system may include a central proof mass with piezoelectric cantilevers extending radially from the proof mass in a symmetric pattern. The proof mass moves in response to vibrations induced on the portable electronic device, and the movement of the proof mass is converted by the piezoelectric cantilevers into electrical energy. By arranging the piezoelectric cantilevers symmetrically around the proof mass, typical problems associated with cracking of the piezoelectric panels due to over vibrating is mitigated, as the vibrations experienced by each piezoelectric cantilever controls and is controlled by the vibration experienced by an opposing cantilever. In one implementation, multiple rows of piezoelectric cantilevers extend from the proof mass, which further increase the generation of electrical energy.

In another implementation, an electromagnetic energy harvester may be incorporated into a compartment within the proof mass to convert the vibrational energy into electrical energy. For example, the electromagnetic energy harvester may include a coil of wire wrapped around a magnet. The magnet may be suspended within the coil by magnetic forces of two additional magnets, one placed above and one placed below the coil of wires. In this implementation, vibrations of the device cause the magnet to move within the coil of wires and, thus, generate an electrical current.

In one particular implementation, the piezoelectric harvester and electromagnetic energy harvester may be incorporated into a single harvester. By incorporating both the piezoelectric design and the electromagnetic design into one harvester, the amount of energy converted from vibrations of the portable device may be significantly and synergistically increased. For instance, the piezoelectric design generates relatively high voltage and the electromagnetic design generates relatively high current. By utilizing both in a single harvester, the harvester is able to produced both substantial voltage and substantial current resulting in better conversion ratios and higher overall power output.

In some implementations, panels of multiple energy harvesters, either piezoelectric, electromagnetic or a combination may be incorporated into a portable electronic device. Thus, the number of energy harvesters per panel may be tailored to the particular energy needs and available space of each portable electronic device. Further, the piezoelectric cantilevers may be layered in rows extending from the sides of the proof mass. Thus, by both layering (i.e. stacking rows of piezoelectric cantilevers) and arranging the energy harvesters on panels, the energy harvesting system is easily configurable to fit into the various sizes and shapes of the space available within each different type of portable electronic device.

Figure 1:
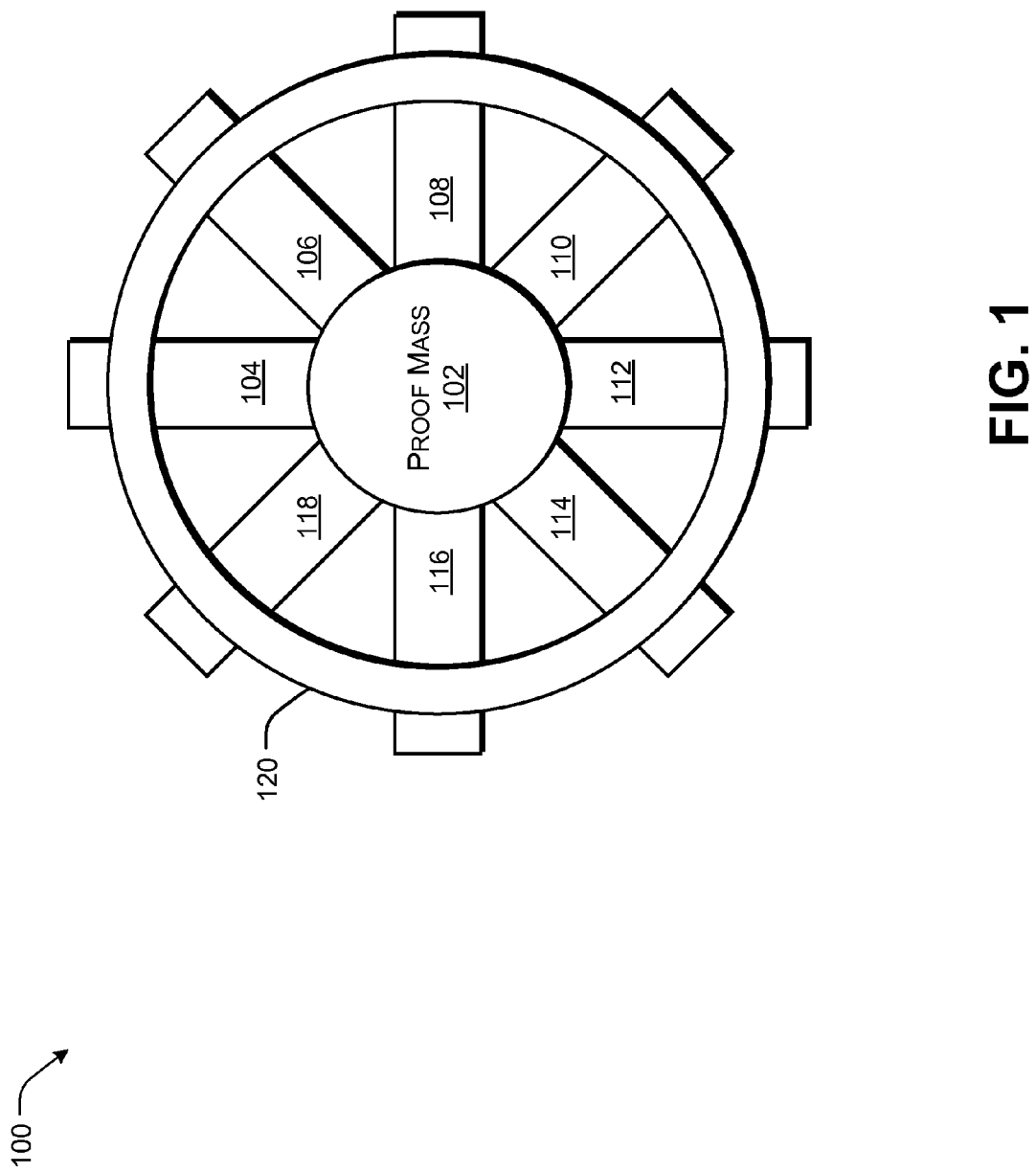
FIG. 1 illustrates a top view of an example energy harvester for the conversion of mechanical vibrations into electrical energy.

FIG. 1 illustrates a top view of an example energy harvester 100 for the conversion of mechanical vibrations into electrical energy. Energy harvester 100 may be incorporated into any number of portable electronic devices for converting vibrations of the portable electronic device into electrical energy. For example, the energy harvester may be incorporated into cell phones, music players, tablet computers, notebook computers, electronic book readers and various other electronic devices. Once converted, the electrical energy may be used to supplement the power provided by the battery and/or to recharge the battery extending the time between wall charges.

In the illustrated implementation, the energy harvester 100 includes a proof mass 102 (or seismic mass) and multiple piezoelectric cantilevers 104, 106, 108, 110, 112, 114, 116 and 118 supported by support 120. Generally, the piezoelectric cantilevers 104-118 are configured to generate electrical energy in response to experiencing mechanical stress or vibrations. The piezoelectric cantilevers 104-118 may be formed from a single crystalline material or a polycrystalline material, for example, Berlinite, Sucrose, Quartz, Rochelle salt, Topaz or Tourmaline-group minerals. In one specific implementation, the piezoelectric cantilevers 104-118 may be formed from Lead Zirconate Titantie, also known as PZT.

The piezoelectric cantilevers 104-118 may also be tuned to a resonance frequency associated with the portable electronic device. For example, the energy harvester may be tuned to resonate at a known frequency. As one example, the piezoelectric cantilevers 104-118 may then be tuned to resonate at a frequency corresponding to the walking gait of the average individual. The harvester may be tuned by varying the type of material used, the thickness of the cantilevers, the length of the cantilevers, and/or the mass of the proof mass 102. In one particular implementation, the piezoelectric cantilevers 104-118 are tuned to a working frequency range of 60-120 Hz, the frequency range typically experienced by a portable electronic device during use.

The piezoelectric cantilevers 104-118 extend radially outward from the proof mass 102 in symmetric pattern, such that each of the piezoelectric cantilevers 104-118 have an opposing cantilever that extends from the proof mass 102 in the opposite direction. For example as illustrated, the piezoelectric cantilever 104 and the piezoelectric cantilever 112, the piezoelectric cantilever 106 and the piezoelectric cantilever 114, the piezoelectric cantilever 108 and the piezoelectric cantilever 116 and the piezoelectric cantilever 110 and the piezoelectric cantilever 118 form opposing symmetric pairs.

By arranging the piezoelectric cantilevers 104-118 in symmetric pairs, the vibration of each piezoelectric cantilever 104-118 is controlled by its symmetrically paired partner. For example, the vibration of the piezoelectric cantilever 104 controls the vibration of the piezoelectric cantilever 112 and the vibration of the piezoelectric cantilever 112 controls the vibration of the piezoelectric cantilever 104. The vibration of the piezoelectric cantilever 106 controls the vibration of the piezoelectric cantilever 114 and the vibration of the piezoelectric cantilever 114 controls the vibration of the piezoelectric cantilever 106. The vibration of the piezoelectric cantilever 108 controls the vibration of the piezoelectric cantilever 116 and the vibration of the piezoelectric cantilever 116 controls the vibration of the piezoelectric cantilever 108. The vibration of the piezoelectric cantilever 110 controls the vibration of the piezoelectric cantilever 118 and the vibration of the piezoelectric cantilever 118 controls the vibration of the piezoelectric cantilever 110.

Therefore, unlike a piezoelectric harvester that utilizes a single piezoelectric element, which is prone to cracking, the energy harvester 100 provides power generation in a consistent reliable manner. The piezoelectric cantilevers 104-118 arranged in symmetric pairs around the proof mass 102 are also able to convert wider ranges of vibrations into electrical energy. However, cracking may still occur. Thus in one particular implementation, the piezoelectric cantilevers 104-118 are connected in parallel, such that if one or more of the piezoelectric cantilevers 104-118 cracks the remaining piezoelectric cantilevers 104-118 continue to provide electrical energy to the portable electronic device.

An additional advantage of utilizing symmetric pairs of piezoelectric cantilevers, such as piezoelectric cantilevers 104-118, is that the total number of piezoelectric cantilevers may be tailored to the energy needs of the portable electronic device. For example, by adding additional pairs of piezoelectric cantilevers the total energy collected by the energy harvester 100 may be increased and by removing pairs of piezoelectric cantilevers the size of the energy harvester 100 may be reduced. Additionally, in other examples, the cantilevers are not necessarily arranged in pairs. For example, three cantilevers may be used, five cantilevers may be arranged in a star pattern, and so forth.

The proof mass 102 oscillates due to vibrations experienced by the portable electronic device to increase the overall energy output. For example, the proof mass 102 may oscillates due to the vibrations associated with moving the portable electronic device to a degree that the piezoelectric cantilevers 104-118 generate significant voltage, even with small piezoelectric panels and small vibrations. Thus, by utilizing the proof mass 102 even small vibrations experienced by the portable electronic device may result in some energy saving.

Once the energy harvester 100 has been incorporated into a portable electronic device, the piezoelectric cantilevers 104-118 of the energy harvester 100 convert vibrations associated with the portable electronic device, such as when the devices is carried or dropped, into electrical energy. In general, the proof mass 102 vibrates as the portable electronic device is moved. The piezoelectric cantilevers 104-118 convert the mechanical energy associated with the vibrations into electrical energy, which may be stored or utilized to operate components of the portable electronic device. For example, the electrical energy generated by the piezoelectric cantilevers 104-118 may be stored using one or more capacitors.

Figure 2:
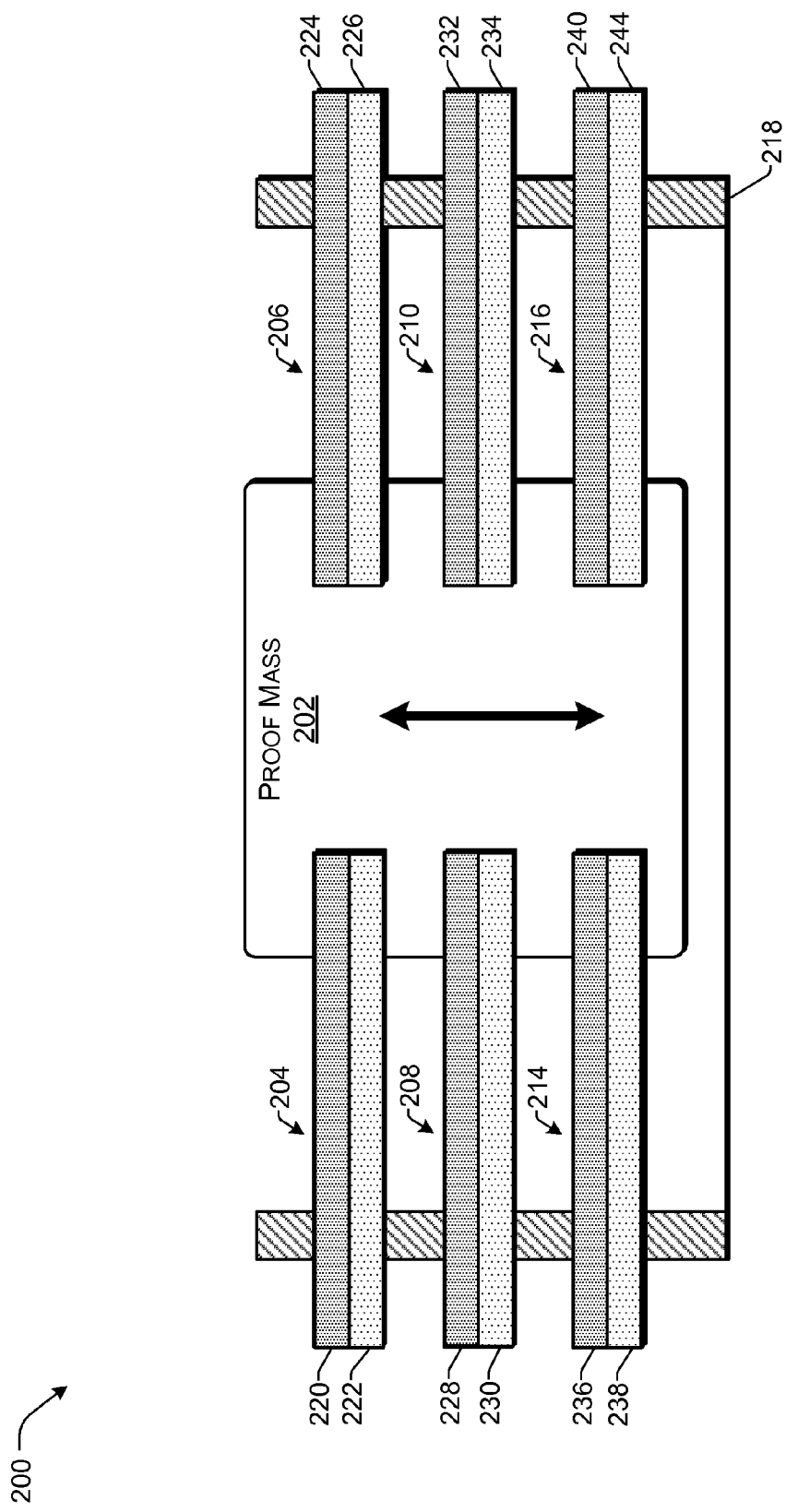
FIG. 2 illustrates a side view of an example energy harvester for the conversion of mechanical vibrations into electrical energy.

FIG. 2 illustrates a side view of an example energy harvester 200 for the conversion of mechanical vibrations into electrical energy. The energy harvester 200 includes a proof mass 202 and multiple piezoelectric cantilevers 204, 206, 208, 210, 214 and 216 supported by support 218. As described above, the proof mass 202 oscillates due to the vibrations experienced by a portable electronic device and the piezoelectric cantilevers 204-216 convert the motion of the proof mass 202 into electrical energy, which may be stored or utilized to operate components of the portable electronic device.

In the illustrated example, the piezoelectric cantilevers 204-216 are arranged in symmetric pairs extending outward from the proof mass 202. In this example, the piezoelectric cantilevers 204-216 are stacked in rows. By utilizing multiple stacked layers or rows of piezoelectric cantilevers, the energy generation of the energy harvester 200 may be increased without significantly impacting the overall size of the portable electronic device. For example, the energy harvester 200 may include multiple rows of the piezoelectric cantilevers. Thus, the energy harvester 200 is capable of providing good energy output in a multitude of circumstances.

In the illustrated example three rows are shown, however, any number of rows may be utilized depending upon space available and energy requirements of the portable electronic device into which the energy harvester 200 is incorporated. Thus, the energy generation of the energy harvester 200 may be tailored to the specific requirements of the portable electronic device without significantly increasing size requirements, as the same proof mass 202 may be utilized to oscillates in response to the vibrations of the portable device for flexing multiple rows of piezoelectric cantilevers 204-216.

The piezoelectric cantilevers 204-216 formed from two layers of material, such as a bilaminar PZT or bimorph. For instance, in the illustrated implementation, the piezoelectric cantilevers 204-216 are each composed of two layers represented by layers, for example, piezoelectric cantilever 206 is formed from layers 220 and 222, piezoelectric cantilever 208 is formed from layers 228 and 230, piezoelectric cantilever 210 is formed from layers 232 and 234, piezoelectric cantilever 212 is formed from layers 236 and 238 and piezoelectric cantilever 214 is formed from layers 240 and 242.

Figure 3:
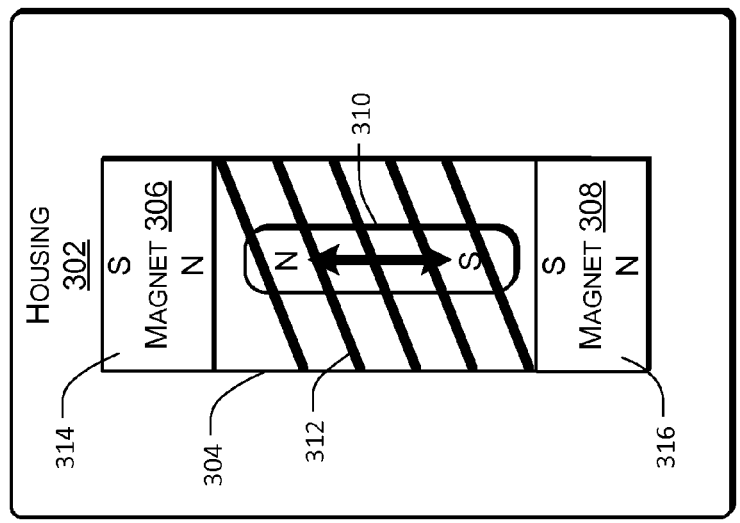
FIG. 3 illustrates a side view of an example energy harvester for the conversion of mechanical vibrations into electrical energy.

FIG. 3 illustrates a side view of another example energy harvester 300 for the conversion of mechanical vibrations into electrical energy. The energy harvester 300 is illustrated as an electromagnetic energy harvester, as an alternative implementation to the piezoelectric energy harvesters 100 and 200 of FIGS. 1 and 2. The energy harvester 300 includes a housing 302. The housing 302 includes a compartment 304 with an electromagnetic energy harvesting system.

The compartment 304 has a first end 314 and a second end 316. A first magnet 306 is located at the first end 314 and a second magnet 308 is located at the second end 316. A coil of wire 312 extends between the first magnet 306 and the second magnet 308. A third magnet 310 is positioned between the first and second magnets 306 and 308 within the coil 312, such that when the proof mass 302 vibrates the third magnet 310 oscillates causing a current to flow within the coil of wires 312 to generate electrical energy. In one particular implementation, the third magnet 310 is freely suspended between the first magnet 306 and the second magnet 308, such that the magnetic forces applied by the first magnet 306 and the second magnet 308 on the third magnet 310 hold the third magnet 310 in place within the coil of wires 312 without any additional supports. By configuring the electromagnetic energy harvesting system in this manner, the magnetic forces of the first magnet 306 and the second magnet 308 cause the third magnet 310 to oscillate and generate a current within the coil of wires 312.

In general, the third magnet 310 oscillates between the first magnet 306 and the second magnet 308, such that an electrical current is generated within the coil of wires 312. In one example, the coil of wires 312 may be coupled to a battery, such that the current flows freely into the battery (not shown in FIG. 3) to recharge the battery. In another example, the coil of wires 312 may be coupled to one or more capacitors (not shown in FIG. 3), which store the current as a charge until a threshold level is reached. When the threshold level is achieved, the one or more capacitors release the charge into the battery providing a partial recharge. In yet another example, the coil of wires 312 may be directly coupled to one or more select components of the portable electronic device to assist in providing power to the select components.

Figure 4:
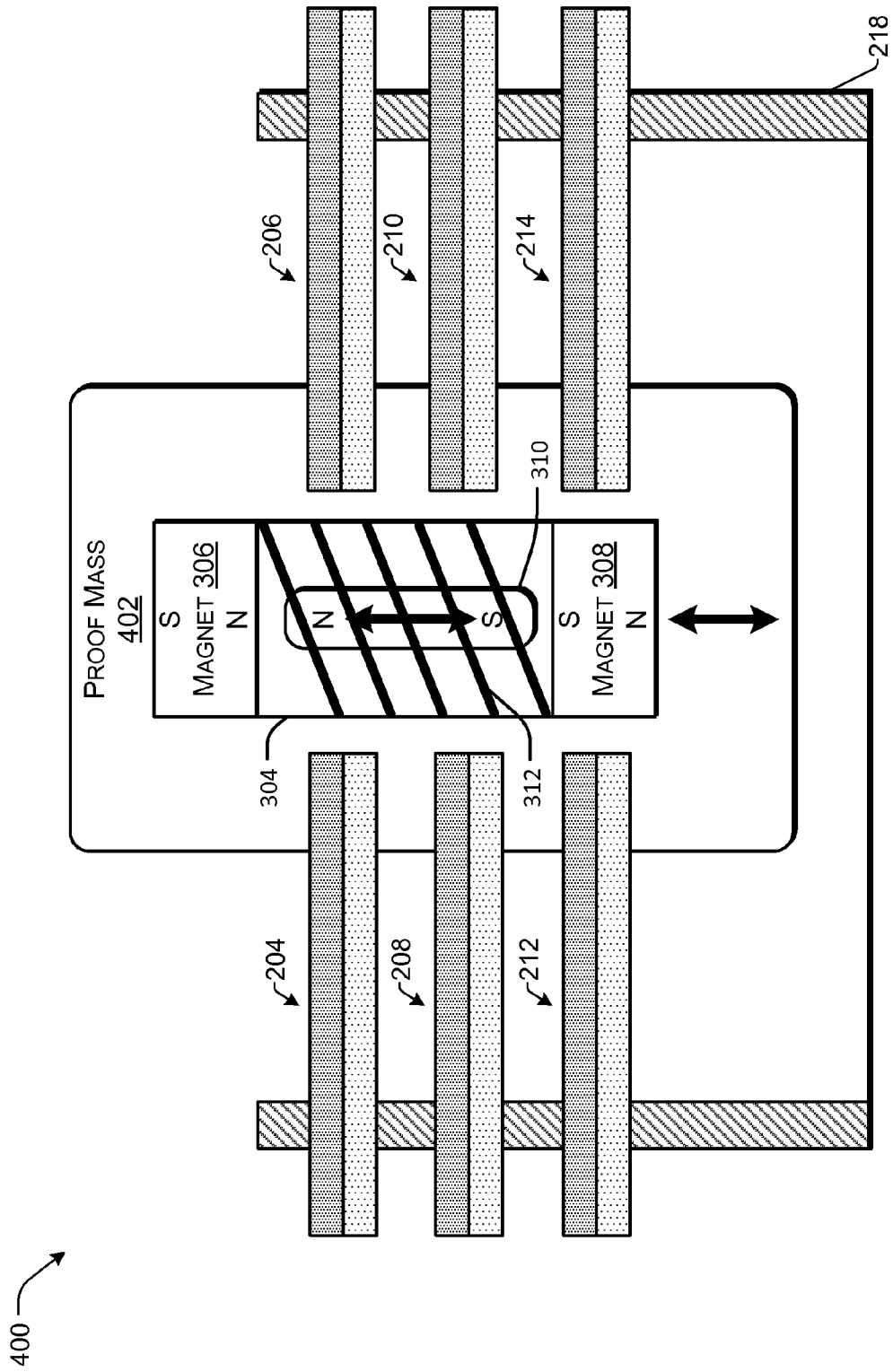
FIG. 4 illustrates a side view of an example of an energy harvester 400 for the conversion of mechanical vibrations into electrical energy.

FIG. 4 illustrates a side view of an example of an energy harvester 400 for the conversion of mechanical vibrations into electrical energy. The energy harvester 400 incorporates both the piezoelectric cantilevers of FIGS. 1 and 2, illustrated as piezoelectric cantilevers 204-214, and the electromagnetic harvester 304 of FIG. 3. The combined design further improves the overall ratio of space to energy generation of the energy harvester 400.

For instance, the piezoelectric harvester generates a higher voltage than the electromagnetic harvester, and the electromagnetic harvester generates a higher current than the piezoelectric harvester. By utilizing both the piezoelectric harvester and the electromagnetic harvester in a single harvester 400, the energy harvester 400 is able to synergistically produce both substantial voltage and substantial current, resulting in better conversion ratios and generating more power over time than either of the piezoelectric harvester or the electromagnetic harvester. Additionally, as the electromagnetic harvester 302 is incorporated into the compartment 304 of the proof mass 402, combining the electromagnetic harvester 302 with the piezoelectric designs does not increase the overall size of the energy harvester 400.

In general, the proof mass 402 vibrates as the portable electronic device moves. As the proof mass 402 vibrates, the third magnet 310 oscillates between the first magnet 306 in the second magnet 308, such that an electrical current is generated within the coil of wires 312. Further, as the proof mass 402 vibrates, the piezoelectric cantilevers 204-214 supported by support 218 experience mechanical stress due to the vibrations of the proof mass 402 with respect to the stationary support 218. As the piezoelectric cantilevers 204-214 experiencing the mechanical stress, The piezoelectric cantilevers 204-214 generate a voltage which may be utilized with the electrical current generated by the electromagnetic harvester 304 to recharge the battery.

Figure 5:
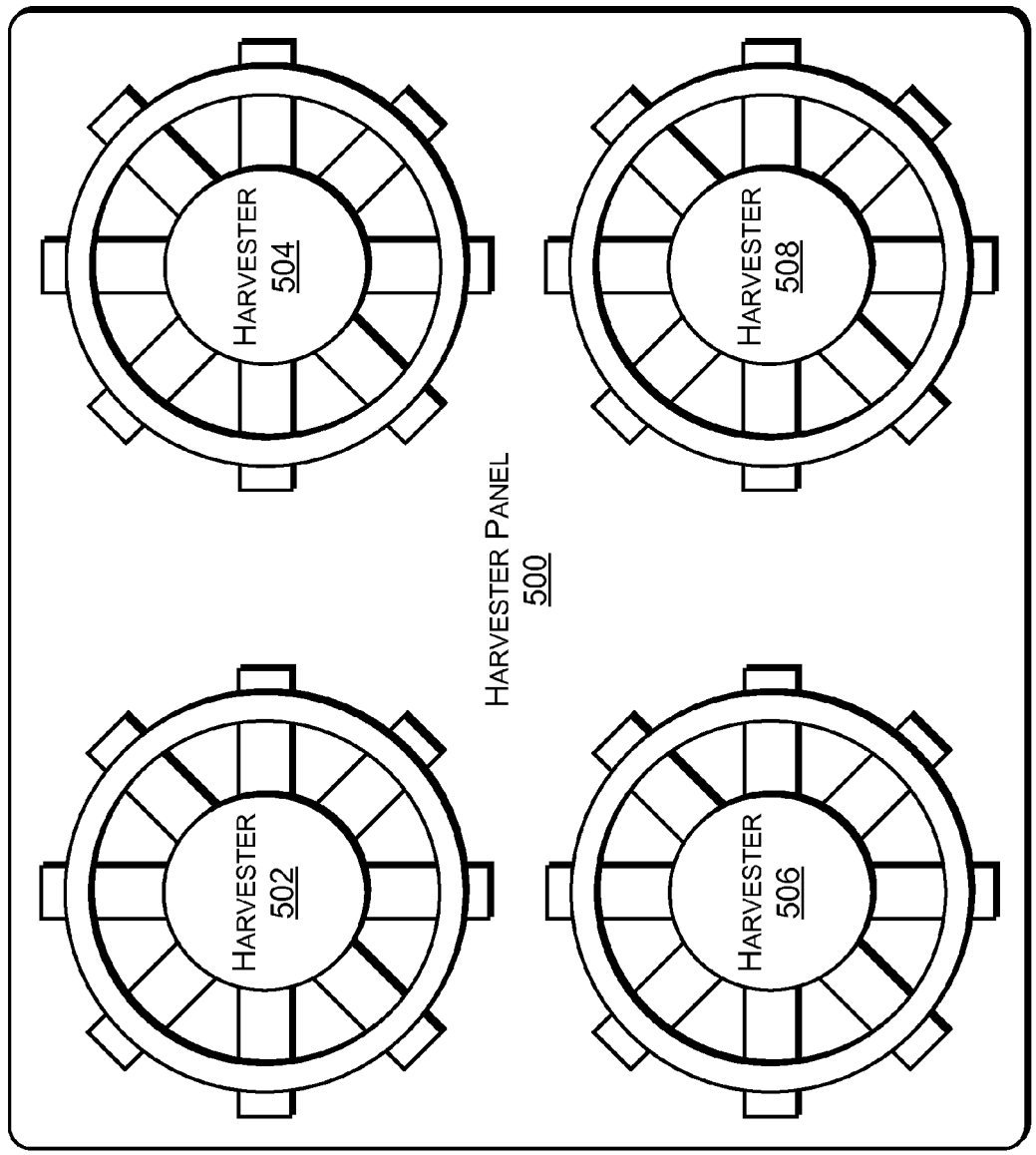
FIG. 5 illustrates a top view of an example panel of energy harvesters for use in portable electronic devices.

FIG. 5 illustrates a top view of an example panel 500 of energy harvesters 502, 504, 506 and 508 for use in portable electronic devices. In the illustrated example, four energy harvesters 502-508 are arranged in a square pattern on harvester panel 500. The harvester panel 500 is one example of a panel 500, which may be incorporated into a portable electronic device. The number of harvesters 502-508 per panel may vary depending upon space available and energy requirements of the portable electronic device into which the harvester panel 500 is incorporated. The size and shape of the panel 500 may also be selected based on the space available and the energy requirements of the portable electronic device. For example, a square pattern is illustrated in FIG. 5; however, various other patterns such as circles, triangles or even trapezoids may be utilized. Further, the harvesters 502 need not be arranged in a panel, but may be arranged or distributed throughout a portable device, as space permits. For example, the harvesters may be arranged one or more each in the four corners of a device, or in any other suitable location within a device, as size permits. Accordingly, numerous variations will be apparent to those of skill in the art having the benefit of the disclosure herein.

The harvesters 502-508 may also be tuned to resonate at different frequencies for different types of motion to provide more constant energy generation during a variety of circumstances. For instance, the harvester 502 may be tuned to the vibrations associated with the operation of the electronic device, the harvester 504 may be tuned to the resonance frequency associated with movement the portable electronic device by a user, the harvester 506 may be tuned to the resonance frequency associated with the vibrations the portable electronic device experienced when the portable electronic device is dropped. Thus, the energy panel 500 is capable of providing good energy output in a multitude of circumstances.

Figure 6:
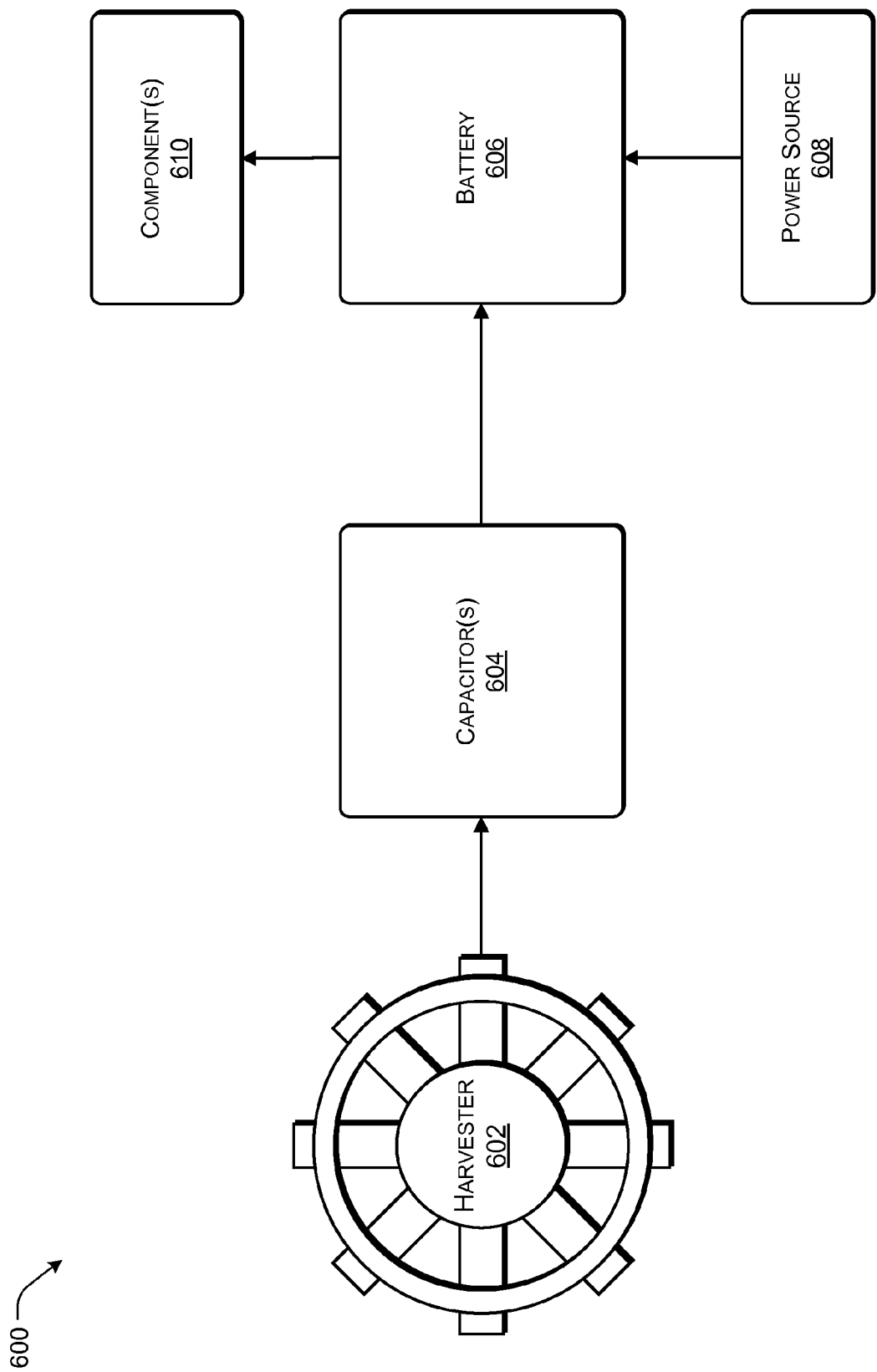
FIG. 6 illustrates a pictorial diagram of an example circuit including an energy harvester.

FIG. 6 illustrates a pictorial diagram of an example circuit 600 including an energy harvester 602. The circuit 600 includes one or more energy harvesters, such as energy harvester 602, coupled to one or more capacitors 604. The energy harvester 602 may correspond to any of the energy harvesters described herein, and is configured to convert vibrations of the portable electronic device into electrical energy, which is provided to the one or more capacitors 604. For example, the energy harvester 602 may comprise a proof mass with multiple piezoelectric cantilevers extending radially outward from the proof mass (as discussed above with respect to FIGS. 1, 2 and 4), such that vibrations of the portable electronic device are converted by the piezoelectric cantilevers into electrical energy. In other examples, the energy harvester 602 may include one or more electromagnetic harvesting units (in addition to or in lieu of the piezoelectric cantilevers) within the proof mass, as described above with respect to FIGS. 3 and 4.

The capacitor 604 is coupled to the energy harvester 602 and the battery 606. The capacitor 604 is configured to receive electrical energy from the harvester 602 and store the energy until a threshold level is reached. Once the threshold level is reached, the capacitor 604 may be configured to release the stored energy into the battery 606 to provide a partial recharge of the battery 606, thus, extending the battery life of the portable electronic device. In an alternative embodiment, the energy harvester 602 is coupled directly to the battery 606, such that the battery 606 receives frequent small recharges whenever the portable electronic device experiences vibrations. The battery 606 is further coupled to one or more components 610, such that the battery 606 is able to provide a stable source of power to the one or more components 610 while the portable electronic device is in operation. The battery 606 is further configured to releasably couple to one or more power sources 608 for recharging.

In the manner described above, the battery 606 is able to receive periodic partial recharges during use. The number of partial recharges varies based on the number and type of energy harvester 602 and the amount of vibration experienced by the portable electronic device. In some environments, the battery 606 may experience increases in battery life of between 10-20%. Further, in some examples, the components 610 may include a power control unit that determines when to discharge the capacitor 604, such as for applying the charge from the capacitor 604 to charge the battery 606.

Figure 7:
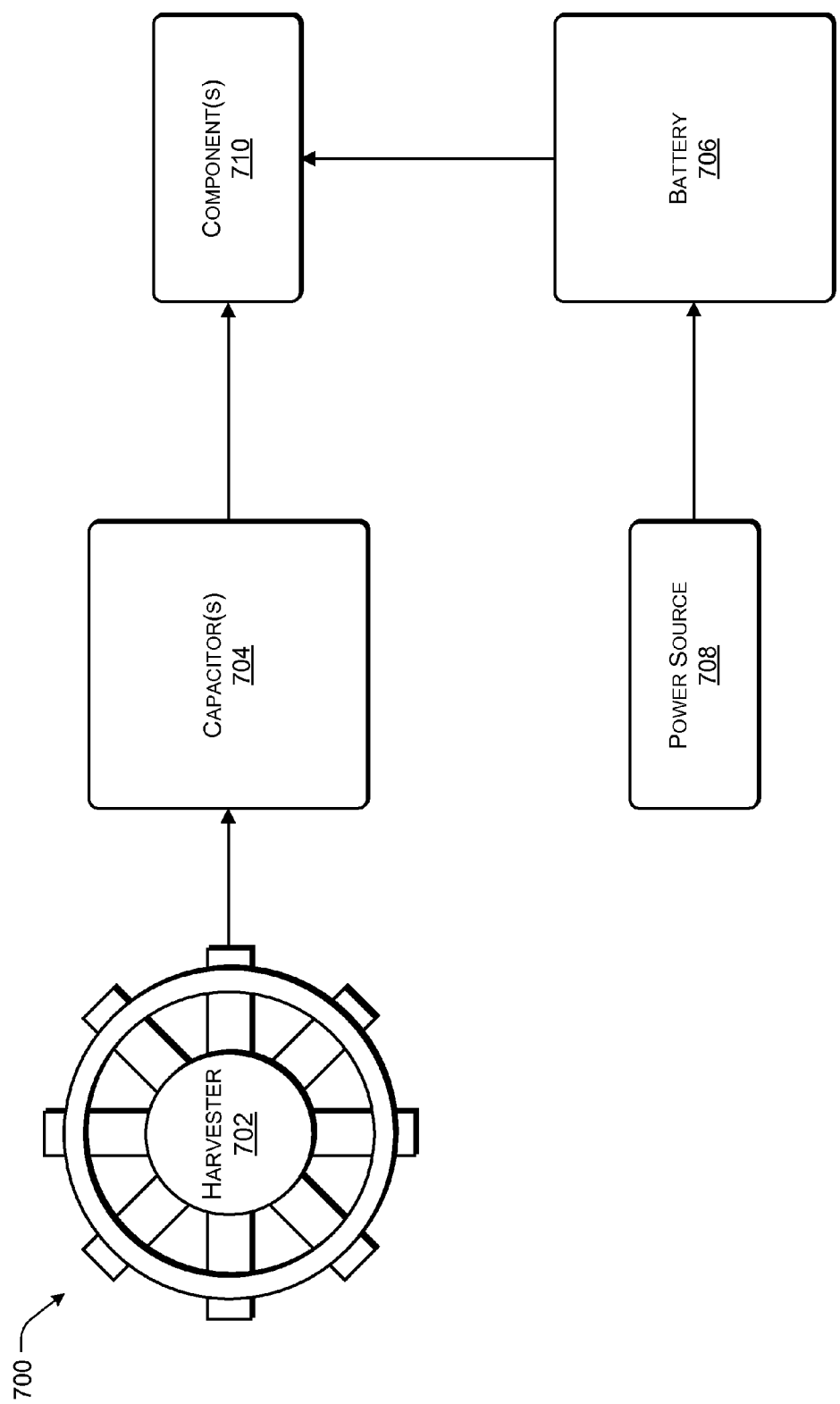
FIG. 7 illustrates a pictorial diagram of another example circuit including an energy harvester.

FIG. 7 illustrates a pictorial diagram of another example circuit 700 including an energy harvester 702. The circuit 700 includes one or more energy harvesters, such as energy harvester 702, coupled to one or more capacitors 704. The energy harvester 702 may correspond to any of the energy harvesters described herein, and is configured to convert vibrations of the portable electronic device into electrical energy, which is provided to the one or capacitors 704. For example, the energy harvester 702 may comprise a proof mass with multiple piezoelectric cantilevers, such that vibrations of the portable electronic device are captured by the proof mass and converted by the multiple piezoelectric cantilevers into electrical energy, as described above with respect to FIGS. 1, 2 and 4. In other examples, the energy harvester 702 may include one or more electromagnetic harvesting units (in addition to or in lieu of the piezoelectric cantilevers) as described above with respect to FIGS. 3 and 4.

In the illustrated example, the capacitor 704 is coupled to the energy harvester 702 and one or more components 710. The capacitors 704 are configured to receive energy from the harvesters 702 and store the energy until a threshold level is reached. Once the threshold level is reached, the capacitors 704 are configured to release the stored energy to the components 710 to assist the battery 706 in powering the components 710. In an alternative embodiment, the energy harvester 702 may be directly coupled to the components 710, such that the energy harvester 702 assists the battery 706 in proving power to the components 710 whenever the portable device experiences vibrations. Further, in some examples, the components 710 may include a power control unit that determines when to discharge the capacitor 704, such as for applying the charge from the capacitor 704 to charge the battery 706 or to power another component 710.

The battery 706 is further couple to the components 710, such that the battery 706 is able to provide a stable source of power to the components 710, for example, if the energy harvester 702 is not producing adequate energy. The battery 706 is further configured to releasably couple to one or more power sources 708 for allow the battery 706 to recharge.

Figure 8:
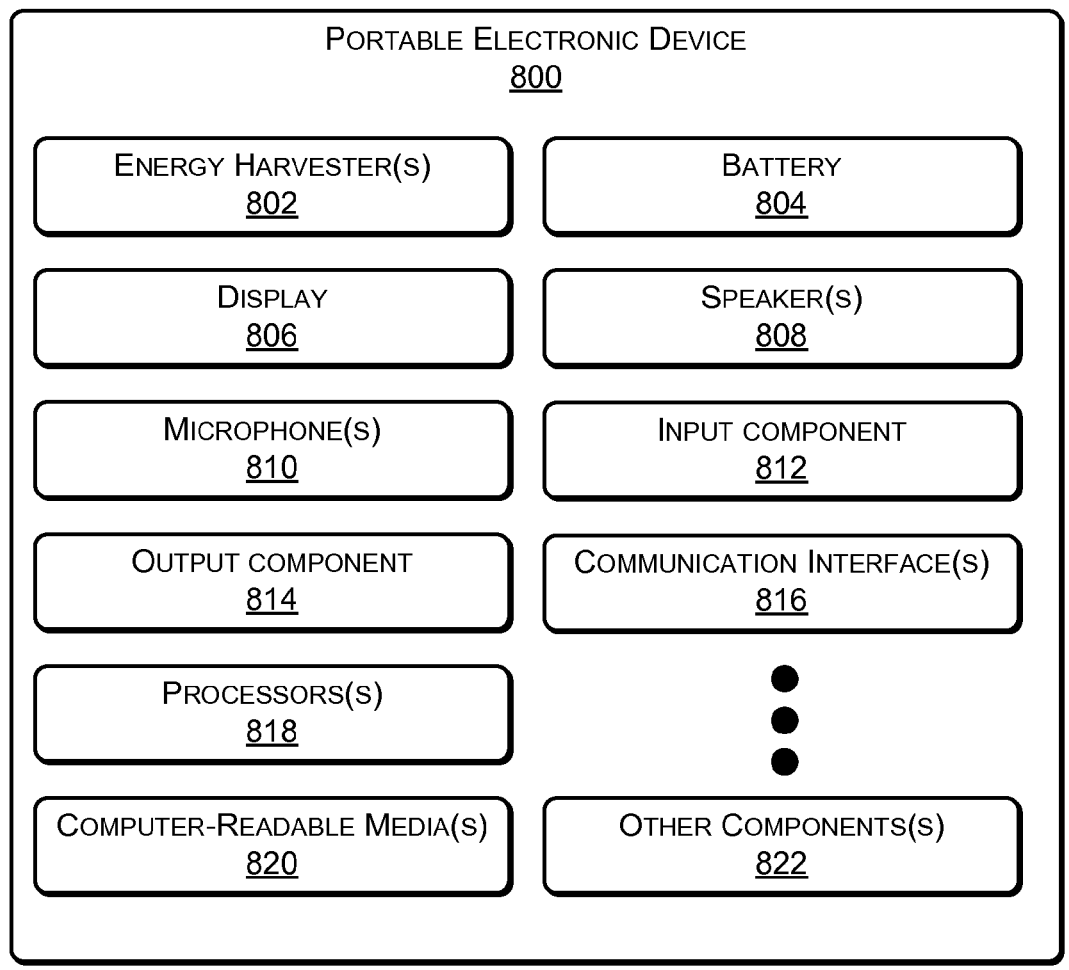
FIG. 8 illustrates an example of a portable electronic device into which the energy harvester may be incorporated.

FIG. 8 illustrates an example of a portable electronic device 800 into which the energy harvester 802 may be incorporated. The portable electronic device 800 includes one or more energy harvesters 802 and at least one battery 804. The energy harvesters 802 may include one or more of the energy harvesters 100, 200, 300, 400 (described above) or any combination thereof. The energy harvesters 802 may also be implemented as one or more harvester panels, such as harvester panel 500 or 600, described above. The size and arrangement of the harvester panels may be configured for the particular make and model of the portable electronic device 800.

The portable electronic device 800 also includes various components, such as a display 806, one or more speakers 808, one or more microphones 810, one or more input interfaces 812, one or more output interfaces 814, one or more communication interfaces 816, one or more processors 818, one or more computer-readable storage media 820 and/or various other components 822.

In one configuration, the portable electronic device 800 includes, or accesses, components such as at least one control logic circuit, central processing unit, and/or the processor 818, in addition to one or more computer-readable media 820 to perform the function of the portable electronic device 800 in software. The processors 818 may itself comprise one or more processors or processing cores. Depending on the configuration of the portable electronic device 800, the computer-readable media 820 may be an example of tangible non-transitory computer storage media and may include volatile and nonvolatile memory and/or removable and non-removable media implemented in any type of technology for storage of information such as computer-readable instructions, data structures, program modules or other data. Such computer-readable media may include, but is not limited to, RAM, ROM, EEPROM, flash memory or other computer-readable media technology, CD-ROM, digital versatile disks (DVD) or other optical storage, magnetic cassettes, magnetic tape, solid state storage, magnetic disk storage, RAID storage systems, storage arrays, network attached storage, storage area networks, cloud storage, or any other medium that can be used to store information and which can be accessed by the processors 818 directly or through another device. Accordingly, the computer-readable media 820 may be computer-readable media able to store and maintain instructions, modules or components executable by the processors 818.

In general, the battery 804 provides power to the other components 822, while the portable electronic device 800 is in use. The energy harvesters 802 also convert mechanical energy associated with vibrations of the portable electronic device 800 into electrical energy. The electrical energy generated by the energy harvesters 802 is utilized to recharge the battery 804, while the portable electronic device 800 is in use. For example, the electrical energy generated may be stored as a charge on one or more capacitors until a desired charge is achieved. Once the desired charge is reached, the charge may be released by the one or more capacitors into the battery 804. In this way, the time between wall charges may be increased. In some implementations, the expected power savings to the battery 804 may be up to 20%.

Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed is:

1. A device comprising:
   an energy harvester to convert vibrations of the device into electrical energy, the energy harvester including:
   a proof mass having a compartment;
   at least two piezoelectric cantilever transducers extending outward from the proof mass in opposite directions, the piezoelectric cantilever transducers supporting the proof mass to allow movement of the proof mass in response to the vibrations; and
   a first magnet is partially contained within a first end of the compartment;
   a second magnet is partially contained within a second end of the compartment, the second end opposite the first end;
   a coil at least partially wound around at least a portion of the compartment; and a third magnet suspended within the compartment between the first magnet and the second magnet by repulsive magnetic forces of the first magnet and the second magnet; and a capacitor having a first end coupled to the coil and the piezoelectric cantilever transducers to collect the electrical energy generated by the energy harvester and store the electrical energy and a second end coupled to a battery.

2. The device as recited in claim 1, wherein:

the at least two piezoelectric cantilever transducers extending outward from the proof mass form a first symmetric pattern centered on the proof mass and are associated with a first row of piezoelectric cantilevers transducers; and the energy harvester includes a second row of piezoelectric cantilevers transducers, the second row of piezoelectric cantilever transducers including at least two additional piezoelectric cantilever transducers extending outward from the proof mass to form a second symmetric pattern centered on the proof mass.

3. An energy harvester comprising:

a compartment within the energy harvester;

a first magnet is partially contained within a first end of the compartment;

a second magnet is partially contained within a second end of the compartment, the second end opposite the first end;

a coil at least partially wound around a portion of the compartment; and a third magnet suspended within the compartment between the first magnet and the second magnet, the third magnet able to move within the coil to generate an electric current within the coil.

4. The energy harvester as recited in claim 3, wherein the compartment is disposed within a proof mass, further comprising a plurality of piezoelectric cantilever transducers grouped into symmetric pairs, each of the symmetric pairs having two piezoelectric cantilever transducers extending outward from the proof mass in opposite directions.

5. An energy harvester comprising:

a proof mass having a compartment and configured to move in response to vibrations of the energy harvester;

a magnet suspended within the compartment within a coil of wires and configured to oscillate within the coil to generate an electric current within the coil, in response to the vibrations of the energy harvester; and a plurality of piezoelectric cantilever transducers to convert the movement of the proof mass into a charge, the plurality of piezoelectric cantilever transducers extending radially from the proof mass.

6. The energy harvester as recited in claim 5, wherein the plurality of piezoelectric cantilever transducers are grouped into pairs, each of the pairs having two piezoelectric cantilever transducers extending outward from the proof mass in opposite directions.

7. The energy harvester as recited in claim 5, wherein the plurality of piezoelectric cantilever transducers are included in a first row, further comprising a second row of piezoelectric cantilevers transducers, the second row of piezoelectric cantilever transducers extending radially from the proof mass.

8. The energy harvester as recited in claim 7, wherein:

first row of piezoelectric cantilever transducers is in a first symmetric pattern and the second row of piezoelectric cantilever transducers is in a second symmetric pattern; and the first symmetric pattern is substantially the same as the second symmetric pattern.

9. The energy harvester as recited in claim 7, wherein:

first row of piezoelectric cantilever transducers is in a first symmetric pattern and the second row of piezoelectric cantilever transducers is in a second symmetric pattern; and the first symmetric pattern varying from the second symmetric pattern.

10. The energy harvester as recited in claim 5, wherein the compartment further comprises:

a second magnet partially contained within a first end of the compartment; and a third magnet partially contained within a second end of the compartment.

11. The energy harvester as recited in claim 5, wherein the first row of piezoelectric cantilever transducers are at least partially formed from lead zircontate titanate.

12. The energy harvester as recited in claim 5, wherein the first row of piezoelectric cantilever transducers are at least partially formed from a polycrystalline material.

13. The energy harvester as recited in claim 5, wherein the first row of piezoelectric cantilever transducers are at least partially formed from a single crystalline material.

14. The energy harvester as recited in claim 5, wherein the first row of piezoelectric cantilever transducers are tuned for a resonant frequency associated with the processor.

15. The energy harvester as recited in claim 5, wherein the first row of piezoelectric cantilever transducers are connected in parallel.

16. A device comprising:

a plurality of energy harvesters to convert vibrations into electrical energy, at least one the plurality of energy harvesters including:

a proof mass; and at least a first row of piezoelectric cantilevers transducers, each row of piezoelectric cantilever transducers having symmetric pairs of piezoelectric cantilever transducers extending in opposite directions, the piezoelectric cantilever supporting the proof mass to allow movement of the proof mass in response to vibrations of the device.

17. The device as recited in claim 16, further comprising at least a second row of piezoelectric cantilever transducers arranged identically to the first row of piezoelectric cantilevers transducers.

18. The device as recited in claim 16, further comprising a capacitor having a cap coupled in series to the piezoelectric cantilever transducers to collect and store the electrical energy as a charge.

19. The device as recited in claim 18, wherein the capacitor has a second cap coupled to a battery and is configured to release the charge into the battery when a threshold is reached.

20. The device as recited in claim 16, further comprising a battery coupled to the plurality of energy harvesters, the battery to recharge based on the electrical energy generated by the plurality of energy harvesters.

21. The device as recited in claim 16, further comprising at least one component coupled to the plurality of energy harvesters, the at least one component to operate based on the electrical energy generated by the plurality of energy harvesters.

22. The device as recited in claim 16, wherein the proof mass has a compartment including:

a first magnet;

a second magnet;

a coil extending over at least a portion of the compartment; and a third magnet suspended within the coil by magnetic forces of the first magnet and the second magnet, the third magnet to oscillate within the coil to generate an electric current within the coil in response to vibrations of the device.

\* \* \* \* \*